US006650152B2

(12) United States Patent
Kawabata

(10) Patent No.: US 6,650,152 B2
(45) Date of Patent: Nov. 18, 2003

(54) INTERMEDIATE VOLTAGE CONTROL CIRCUIT HAVING REDUCED POWER CONSUMPTION

(75) Inventor: Hiroki Kawabata, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/803,923

(22) Filed: Mar. 13, 2001

(65) Prior Publication Data

US 2001/0026189 A1 Oct. 4, 2001

(30) Foreign Application Priority Data

Mar. 28, 2000 (JP) ........................................ 2000-089637

(51) Int. Cl.[7] ................................................ H03K 3/00
(52) U.S. Cl. ......................... 327/112; 327/391; 326/24
(58) Field of Search ................................ 327/112, 391, 327/327, 331, 332, 333, 111; 326/23, 24, 26, 82, 83, 87; 331/1

(56) References Cited

U.S. PATENT DOCUMENTS 5,889,707 A * 3/1999 Yang ..................... 365/189.05
6,222,403 B1 * 4/2001 Mitsuda ...................... 327/170

FOREIGN PATENT DOCUMENTS

JP 8-171432 7/1996

OTHER PUBLICATIONS

Baifukan, "*Advanced Electronics I–9 Super LSI Memory*", 1994, p. 61.

* cited by examiner

*Primary Examiner*—Tuan T. Lam
*Assistant Examiner*—Hiep Nguyen
(74) *Attorney, Agent, or Firm*—Young & Thompson

(57) ABSTRACT

An intermediate voltage control circuit maintains the signal line at a stable intermediate potential. The circuit comprises a first n-channel transistor; a second p-channel transistor; a monitoring circuit for determining a potential level of a signal line connected to the output node; and a control circuit for sending first and second control signals to a gate of each of the first and second transistors so as to prevent a feedthrough current from flowing in the transistor.

11 Claims, 5 Drawing Sheets

VOLTAGE CHANGE CHARACTERISTIC CURVE WHEN CAPACITIVE LOAD IS CHARGED VIA n-CHANNEL TRANSISTOR

VOLTAGE CHANGE CHARACTERISTIC CURVE WHEN CAPACITIVE LOAD IS DISCHARGED VIA p-CHANNEL TRANSISTOR

INTERMEDIATE VOLTAGE CONTROL CIRCUIT HAVING REDUCED POWER CONSUMPTION

BACKGROUND OF THE INVENTION

1. Field of the Invention

The present invention relates to an intermediate voltage control circuit within integrated circuit chips, and more particularly, to an intermediate voltage control for applying intermediate voltage to a signal line such as digit line connected to a memory cell of a semiconductor memory circuit or a data line connected to a sense amplifier.

2. Description of Related Art

An intermediate voltage control circuit is used to supply an intermediate voltage to a signal line while data is not accessed. More particularly, an intermediate voltage control circuit employs an n-channel transistor in its charging path and a p-channel transistor in its discharging path, respectively.

FIG. 5 shows a circuit diagram describing a configuration of an intermediate potential generator circuit disclosed in Japanese Kokai No. 8-171432. The intermediate generator circuit shown in FIG. 5 is configured by reference potential generating circuit 550 and output circuit 552. The reference potential generating circuit generates (½) Vcc+Vtn as a reference potential Vref1 and (½) Vcc−|Vtp| as a reference potential Vref2, respectively. The output circuit includes an n-channel MOS transistor 521 and a p-channel MOS transistor 522. In the n-channel MOS transistor 521, a drain electrode is connected to a power node 500 and a source electrode is connected to an output node 54. In the p-channel MOS transistor 522, the source electrode is connected to the output node 54 and the drain electrode is connected to a ground node 600. Those transistors 521 and 522 are connected to each other serially between the power node 500 and the ground node 600. The voltage of the output node is fed back to the gate electrodes of the p-channel MOS transistor 501 and the n-channel MOS transistor 504 in the reference voltage generating circuit, respectively.

Vref1 is sent to the gate electrode of the n-channel MOS transistor 521 of the output circuit and Vref2 is sent to the gate electrode of the p-channel MOS transistor 522 of the output circuit. Both of the transistors 521 and 522 are slightly conductive.

In case the voltage of the output node 54 drops, the conductive resistance of the n-channel MOS transistor 521 is reduced, whereby a current flows from the power node 500 to the output node 54 via the transistor 521. The voltage of the output node thus rises. At the same time, because this output node voltage is fed back to the gate electrode of the p-channel MOS transistor 501 in the reference voltage generating circuit, the conductive resistance of the transistor 501 is reduced, whereby a current flows to the node N1. The potential of the gate electrode of the transistor 521 thus rises and the voltage of the output node 54 returns immediately to its initial intermediate potential (½) Vcc.

On the other hand, in case the voltage of the output node 54 rises, the conductive resistances of the p-channel MOS transistor 522 and the n-channel MOS transistor 504 are reduced in the same way, whereby the voltage of the output node 54 returns immediately to its initial intermediate potential.

The conventional technique drives the potential of the output node 54 to an intermediate potential in this manner.

However, in the intermediate potential generator circuit shown in FIG. 5, because the n-channel MOS transistor 521 and the p-channel MOS transistor 522 connected to each other serially in the output means 52 are slightly conductive, a current continues to flow from the power node 500 to the ground node 600. Therefore, wasted power consumption is ongoing in this region.

SUMMARY OF THE INVENTION

An object of the present invention is to provide an intermediate voltage control circuit, which reduces power consumption.

An another object of the present invention is to provide an intermediate voltage control circuit, which outputs stable intermediate voltage.

An intermediate voltage control circuit according to the present invention includes: a monitoring circuit that determines whether the voltage level of a signal line connected to an output node is higher or lower than a predetermined target voltage so as to generate a determination signal; a first n-channel transistor in which the drain is connected to a power node and the source is connected to the output node; a second p-channel transistor in which the drain is connected to a ground node and the source is connected to the output node; and a control circuit that generates a first control signal to be sent to the gate of the first n-channel transistor and a second control signal to be sent to the gate of the second p-channel transistor based on the determination signal received from the monitoring circuit and an enable signal received from an external input node. The control circuit controls the on/off operation of the first and second transistors as follows: in case the enable signal is active and the determination signal received from the monitoring circuit denotes that the voltage of the signal line is high, the control circuit sets both of the first and second control signals to low and in case the determination signal received from the monitoring circuit denotes that the voltage of the signal line is low, the control circuit sets both of the first and second control signals to high so as to turn on/off the first and second transistors, and in case the enable signal is inactive, the control circuit sets the first control signal to low and the second control signal to the high respectively so as to turn off both of the first and second transistors.

The above-described intermediate voltage control circuit is suitable for a semiconductor memory device which incorporates its own intermediate voltage control circuit.

These and other objects of the present invention will be apparent to those of skill in the art from the appended claims when read in light of the following specification and accompanying figures.

BRIEF DESCRIPTION OF THE DRAWINGS

FIG. 4(*b*) illustrates a voltage variation when a capacitive load is discharged via the p-channel transistor.

DETAILED DESCRIPTION OF THE PREFERRED EMBODIMENTS

Figure 1:
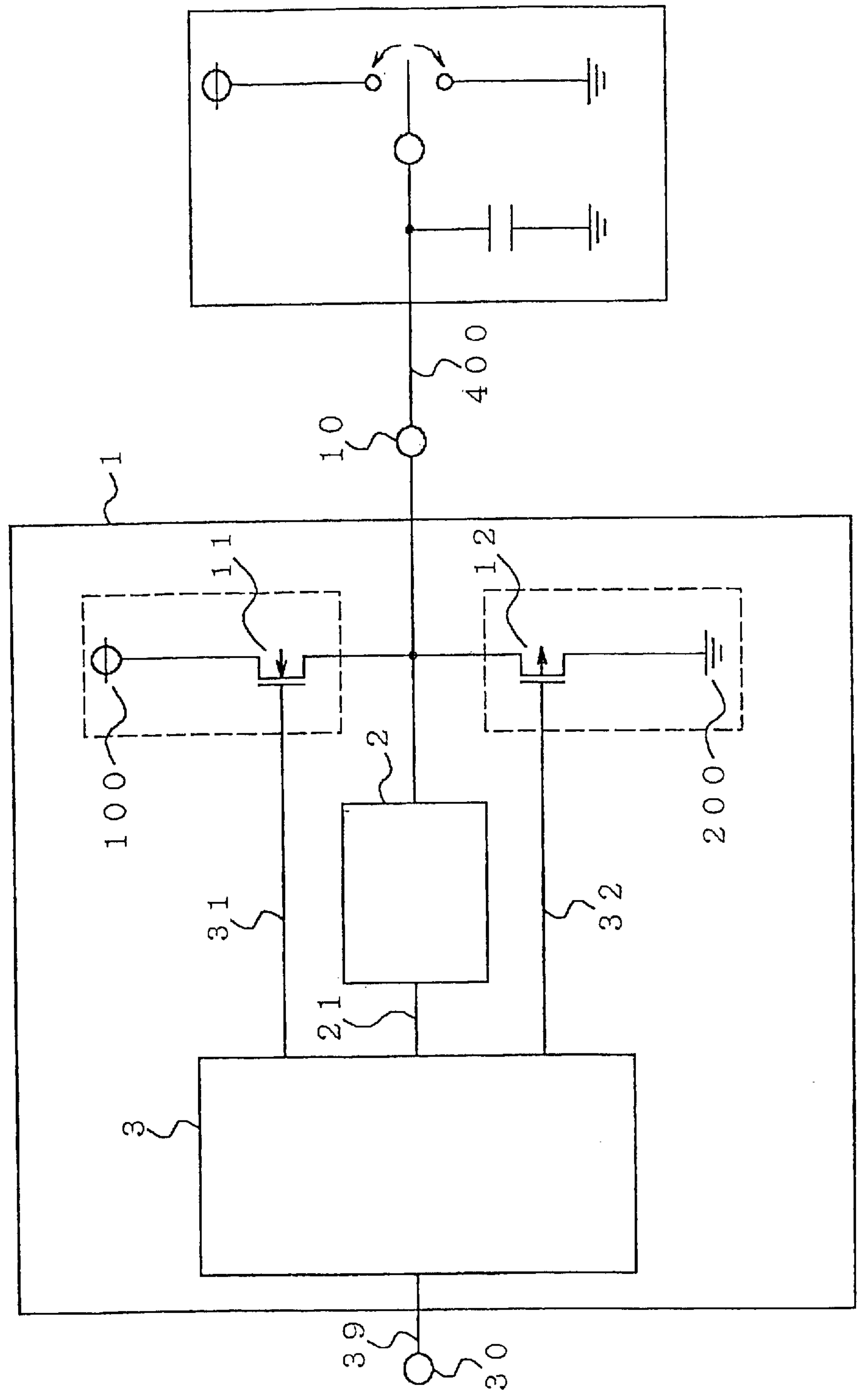
FIG. 1 is a circuit diagram describing an intermediate voltage control circuit in a first embodiment of the present invention.

In FIG. 1, the intermediate voltage control circuit is provided with a monitoring circuit 2 that determines whether the voltage level of a signal line 400 connected to an output node 10 is higher or lower than a predetermined determination voltage so as to generate a determination signal 21; a first n-channel transistor 11 in which the drain is connected to a power node 100 and the source is connected to the output node 10; a second p-channel transistor 12 in which the drain is connected to a ground node 200 and the source is connected to the output node 10; and a control circuit 3 that generates a first control signal 31 to be sent to the gate of the first n-channel transistor 11 and a second control signal 32 to be sent to the gate of the second p-channel transistor 12 in response to the determination signal 21 received from the monitoring circuit 2 and an enable signal 39 received from an external input node 30, respectively.

The control circuit 3 controls the on/off operation of the first and second transistors 11 and 12, respectively, as follows: when the enable signal 39 is active (for a positive logic circuit, logical level "1" is set therein) and the determination signal 21 received from the monitoring circuit 2 denotes that the voltage of the signal line 400 connected to the output node 10 is high, the control circuit 3 sets both first and second control signals 31 and 32 to low, respectively, so as to turn off the first n-channel transistor 11 and turn on the second p-channel transistor 12; and when the determination signal 21 received from the monitoring circuit 2 denotes that the voltage of the signal line 10 is low potential in level, the control circuit 3 sets both first and second control signals 31 and 32 to high, respectively, so as to turn on the first n-channel transistor 11 and turn off the second p-channel transistor 12.

In case the enable signal 39 is inactive (for a positive logic circuit, logical level "0" is set therein), the control circuit 3 sets the first control signal 31 to low and the second control signal 32 to high so as to turn off both of the first and second transistors 11 and 12.

The operation of the intermediate voltage control circuit when the voltage level of the signal line 400 is set to high, will now be described.

As described above, in this case, the first and second control signals 31 and 32 are each set to low and the first n-channel transistor 11 connected to the power node 100 is turned off and the second p-channel transistor 12 connected to the ground node 200 is turned on. Thus, a current flows from the signal line 400 to the ground node 200, whereby the electric charge accumulated in the capacitive load of the signal line 400 is discharged to the ground node 200 via the second p-channel transistor 12.

As described for example in "Advanced Electronics I-9; Super LSI Memory" published by Baifukan, 1994, page 61, p-channel transistors can be charged efficiently but are discharged less efficiently. On the contrary, n-channel transistor, discharge efficiently, but charge less efficiently.

Specifically, in case the charged capacitive load is discharged via a p-channel transistor, the output voltage gradually approaches the threshold voltage Vtp of the p-channel transistor.

Figure 4:
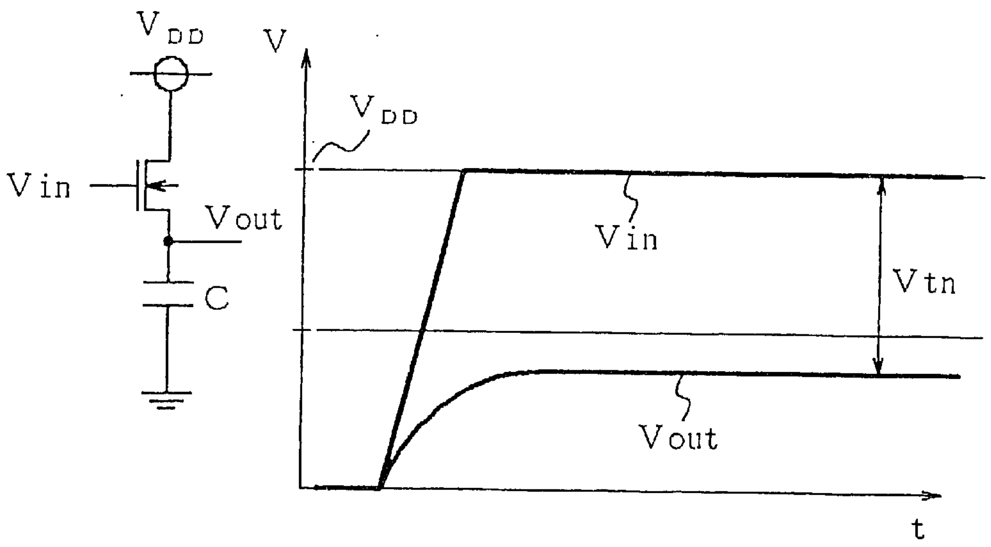
FIG. 4(*a*) illustrates a voltage variation when a capacitive load is charged via the n-channel transistor.
Figure 4:
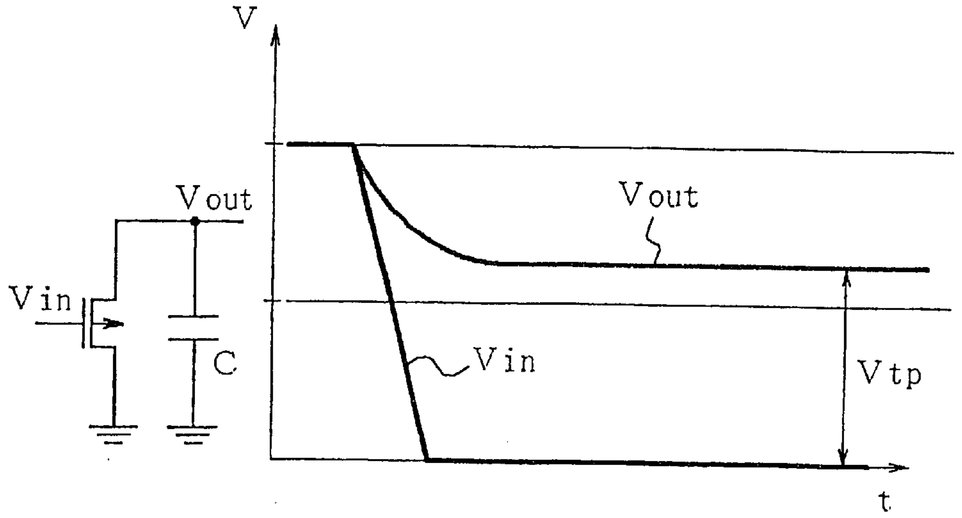
Figure 5:
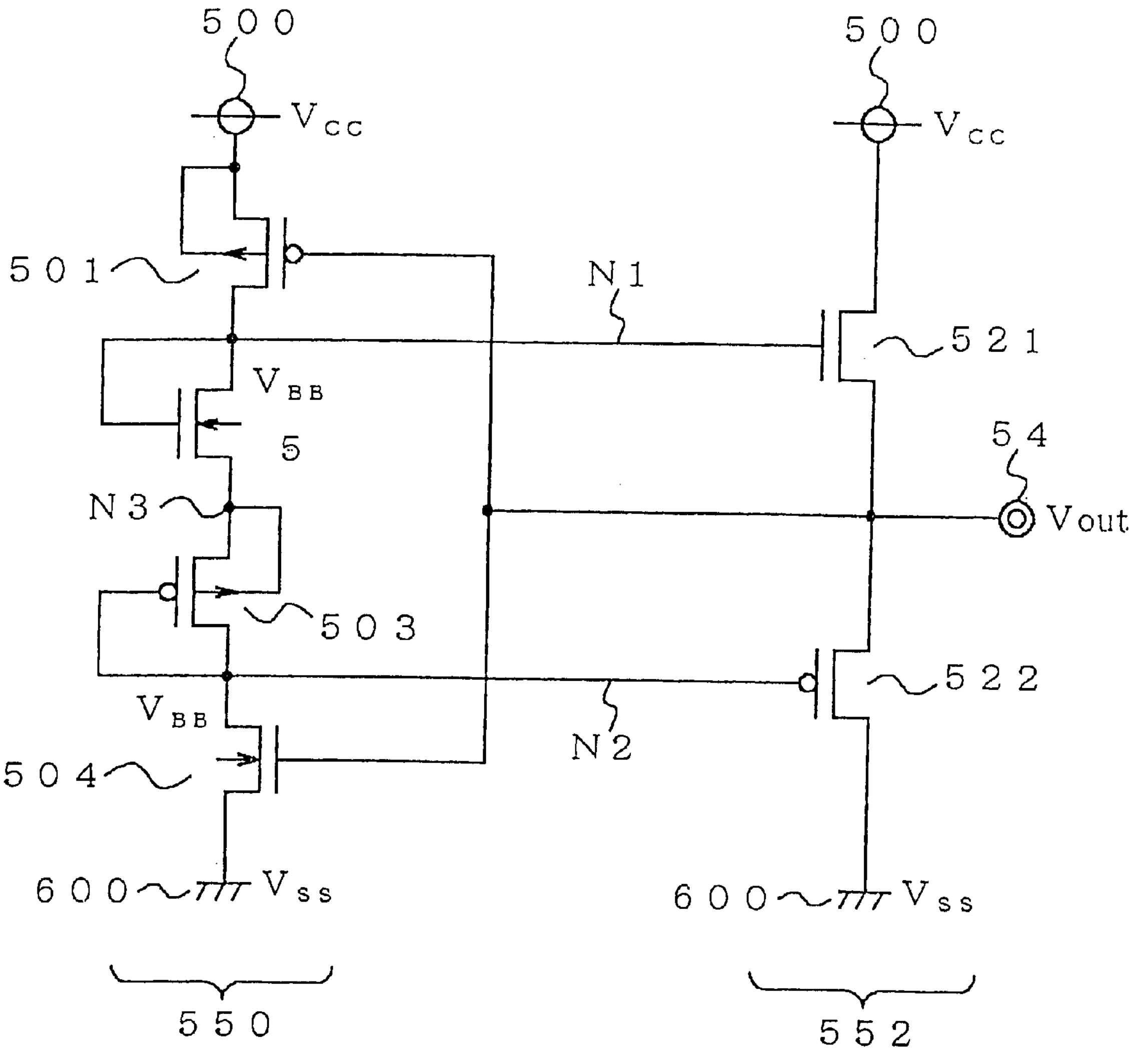
FIG. 5 is a circuit diagram describing the conventional intermediate potential generator circuit described above.

On the contrary, in case the discharged capacitive load is charged via an n-channel transistor, the output voltage gradually approaches a voltage (VDD−Vtn). The voltage (VDD−Vtn) is lower than the power node voltage VDD by the threshold voltage Vtn of the n-channel transistor. FIG. 4 shows an explanatory view of such an operation.

As described above, therefore, while the charged signal line 400 is discharged via the p-channel transistor 12, the voltage of the signal line 400 gradually approaches a voltage higher than the ground node potential by the threshold voltage Vtp of the p-channel transistor 12.

In this case, if the determination voltage of the monitoring circuit is set to an intermediate voltage between the voltages of the power node and the ground node, that is, to (½) VDD and the threshold voltage Vtp of the p-channel transistor 12 to a voltage higher than (½) VDD, which is the above-described determination voltage, the voltage of the signal line 400 is determined to be a high potential voltage during an intermediate potentializing period. Consequently, the voltage level of the signal line 400 is stabilized at the threshold voltage Vtp of the p-channel transistor 12. At this time, the first n-channel transistor 11 is kept off while the voltage of the signal line 400 is stable, so no feedthrough current flows in the transistor 11.

The operation of the intermediate voltage control circuit in this embodiment will now be described for the case wherein the voltage level of the signal line 400 is low. As described above, the first and second control signals 31 and 32 are set to high, whereby the first n-channel transistor 11 connected to the power node is turned on and the second p-channel transistor 12 connected to the ground node is turned off. Consequently, a current flows from the power node 100 to the signal line 400 and the capacitive load of the signal line 400 is charged via the first n-channel transistor 11.

Also in this case, the signal line 400 is charged via the first n-channel transistor 11 as described above, but the voltage of the signal line 400 gradually approaches a voltage (VDD−Vtn), which is lower than the power node potential only by the threshold voltage Vtn of the n-channel transistor 11.

In this embodiment, if the determination voltage of the monitoring circuit is set to an intermediate voltage between the voltages of the power node and the ground node, that is, (½) VDD and the threshold voltage Vtn of the n-channel transistor 11 is set to a voltage higher than the determination voltage ((½) VDD), then the signal line voltage is determined to be in a low state during an intermediate potentializing period. Consequently, the signal line voltage is stabilized at a voltage that is lower than the power node voltage by the threshold voltage Vtn of the n-channel transistor 11. At this time, the second p-channel transistor 12 is kept off while the voltage of the signal line 400 is stabilized, thereby preventing a feedthrough current from flowing in the transistor 12.

Figure 2:
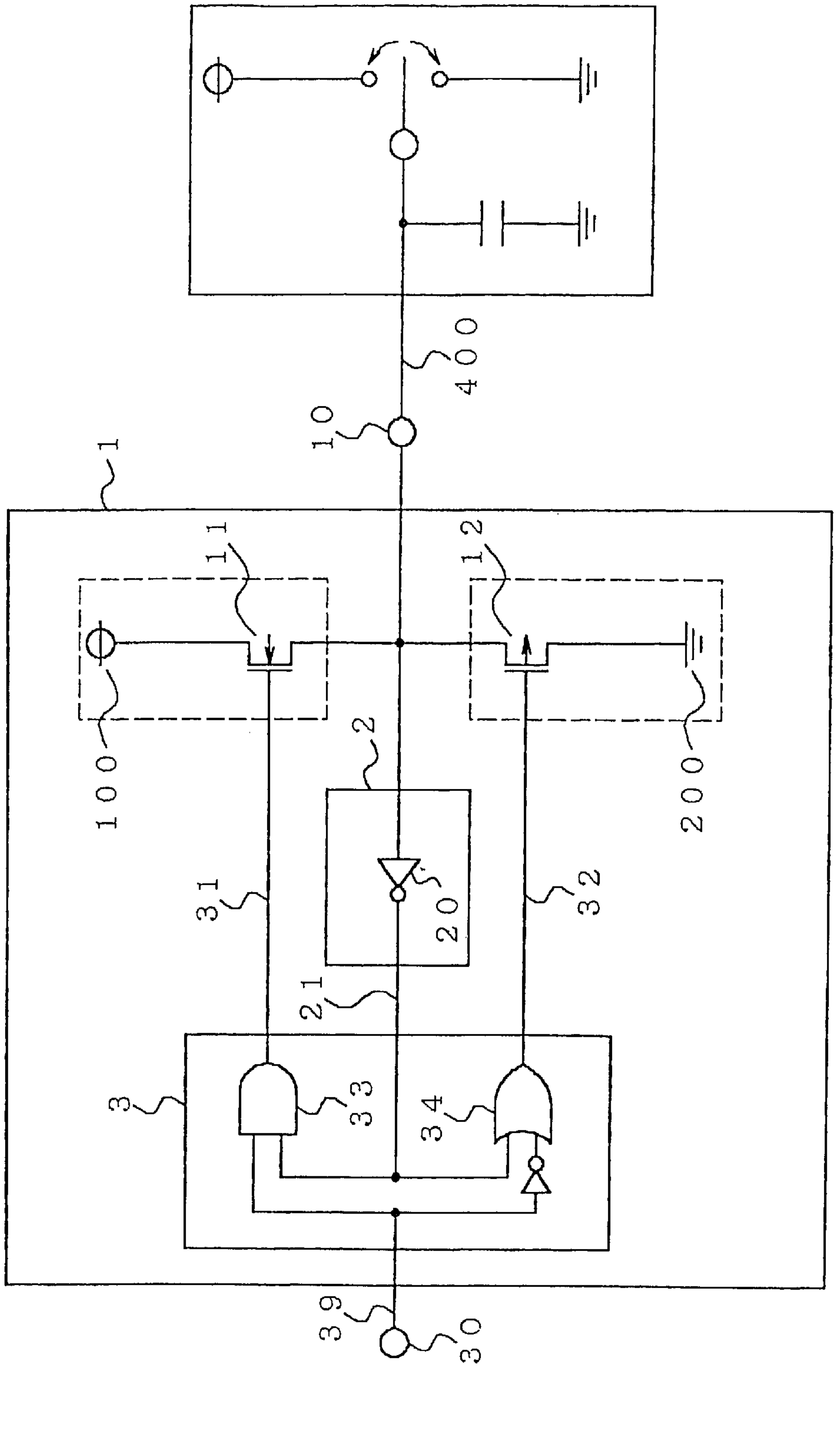
FIG. 2 is a circuit diagram describing a monitoring circuit and a control circuit of the intermediate voltage control shown in FIG. 1.

In FIG. 2, the monitoring circuit 2 is embodied as an inverter circuit 20 having a threshold that determines whether the voltage level of the signal line 400 is higher or lower in potential than a determination voltage, which is the intermediate voltage (½) VDD between the voltage (VDD) of the power node and the voltage (usually, 0V) of the ground node.

Furthermore, the threshold voltage Vtn of the first n-channel transistor 11 and the threshold voltage Vtp of the second p-channel transistor 12 are each set to a voltage higher than the intermediate voltage ((½) VDD).

The control circuit 3 generates the first control signal 31 using AND circuit 33 supplied with the determination signal 21 output and the enable signal 39, and generates the second control signal 32 using the OR circuit 34 supplied with the determination signal 21 and a signal inverted from the enable signal 39.

Figure 3:
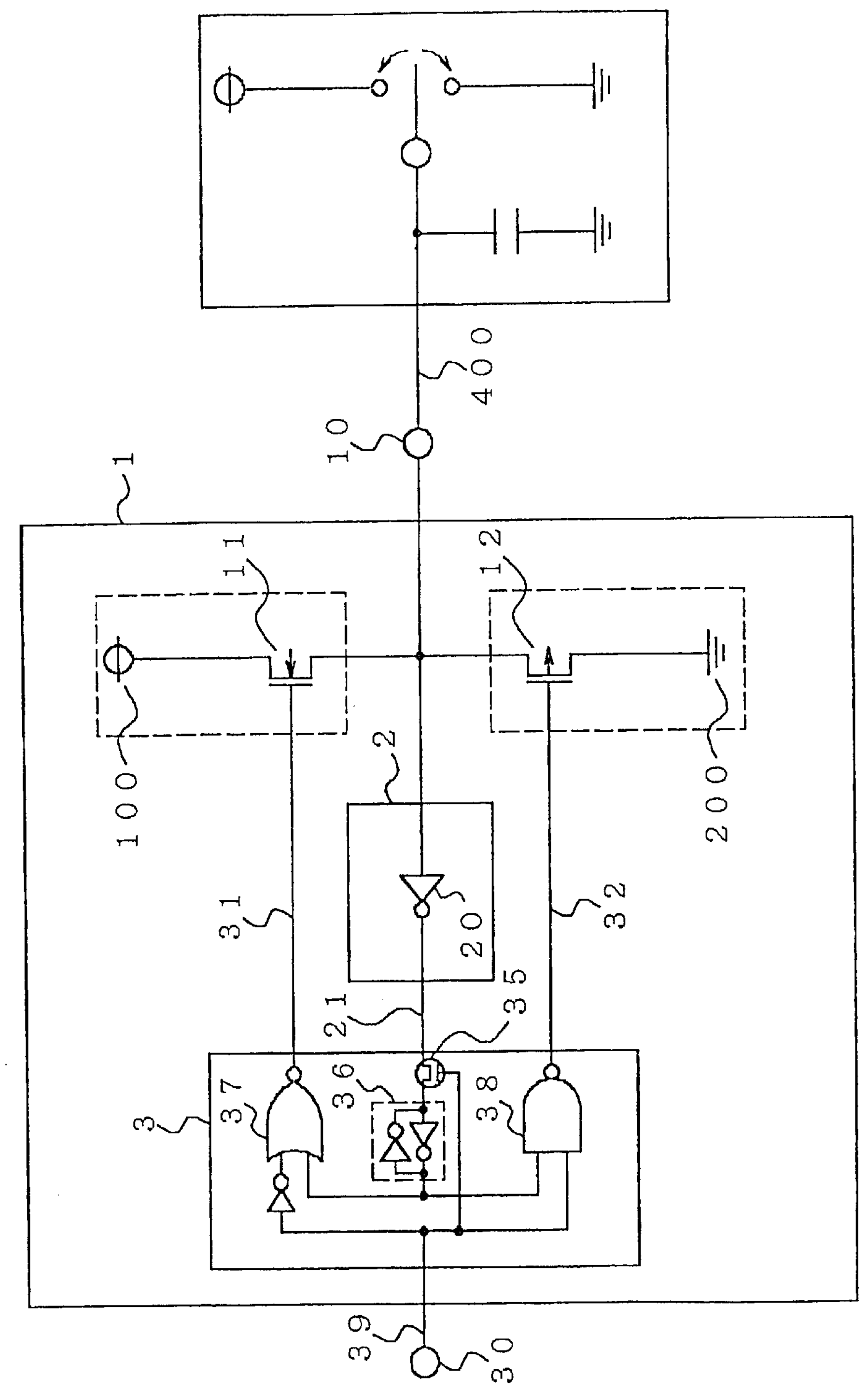
FIG. 3 is a circuit diagram describing an intermediate voltage control circuit in a second embodiment of the present invention.

FIG. 3 shows a circuit diagram describing the intermediate voltage control circuit in the second embodiment of the present invention. The major difference in the circuit diagram shown in FIG. 3 from that shown in FIG. 2 is that the control circuit 3 is provided with a transfer gate circuit 35 controlled by the enable signal 39 to determine whether to receive the determination signal 21, and a latching circuit 36 embodied as two inverter circuits connected to each other like a ring so as to latch the determination signal output from the transfer gate circuit. Consequently, the first control signal is generated by a NOR circuit 37 supplied with the determination signal 21 and a signal inverted from the enable signal 39, and the second control signal is generated by a NAND circuit 38 supplied with the determination signal 21 and the enable signal 39.

With this latching circuit, it is possible to fix the determination signal 21 so as to stabilize the voltage of the output node 10 during an intermediate potentializing period even when the voltage of the signal line 400 varies irregularly.

In the first and second embodiments, the determination signal or the enable signal may of course be changed to a positive or negative logic signal so as to modify the configuration of the logic circuit of the monitoring circuit or the control circuit.

Additionally, it is easy to fabricate the intermediate voltage control circuit described above in an ordinary CMOS process.

Furthermore, it is also easy to employ any intermediate voltage control circuit of the present invention for a semiconductor memory device that must incorporate an intermediate voltage control circuit internally.

As described above, the intermediate voltage control circuit of the present invention uses a monitoring circuit that sets a determination voltage to (½) VDD and a first n-channel transistor whose threshold voltage is set to a voltage higher than the determination voltage for a charging path and a second p-channel transistor whose threshold voltage is set to a voltage higher than the determination voltage for a discharging path. In addition, the intermediate voltage control circuit feeds back the gate voltages of those transistors to control signals with use of the monitoring circuit. Consequently, the present invention provides an intermediate voltage control circuit that can suppress generation of a feedthrough current, reduce power consumption, and output stable signals.

While preferred embodiments of the present invention have been described, it is to be understood that the invention is to be defined by the appended claims when read in light of the specification and when accorded their full range of equivalents.

What is claimed is:

1. An intermediate voltage control circuit comprising:

a first transistor having a first channel type and connected between a power node and an output node, said output node connected to a signal line, said power node supplied with power supply voltage that is higher than ground;

a second transistor having a second channel type and connected between said output node and ground;

a monitoring circuit connected to said output node, and outputting a determination signal in response to a voltage level of said signal line; and a control circuit having an external input node supplied with an enable signal, connected to said monitoring circuit, and controlling each of said first and second transistors, wherein said control circuit turns on one of said first and second transistors and turns off the other of said first and second transistors in response to said determination signal when said enable signal is activated, and said control circuit turns off both of said first and second transistors while said enable signal is inactivated, and wherein said first channel type transistor is an N-channel transistor and said second channel type transistor is a P-channel transistor.

2. The intermediate voltage control circuit according to claim 1, wherein said monitoring circuit has a threshold voltage and determines whether said voltage level of said signal line is higher than said threshold voltage.

3. The intermediate voltage control circuit according to claim 2, wherein said control circuit turns on said first transistor so that said signal line is charged through said first transistor when said voltage level of said signal line is lower than said threshold voltage, and turns on said second transistor so that said signal line is discharged through said second transistor when said voltage level of signal line is higher than said threshold voltage.

4. The intermediate voltage control circuit according to claim 2, wherein said threshold voltage level is a voltage having a value of half of said power supply voltage.

5. The intermediate voltage control circuit according to claim 1, wherein said monitoring circuit includes an inverter circuit.

6. The intermediate voltage control circuit according to claim 1, wherein said control circuit includes an AND circuit supplied with said enable signal and said determination signal and providing a first control signal for said first transistor, and an OR circuit supplied with an inversion of said enable signal and said determination signal and providing a second control signal for said second transistor.

7. The intermediate voltage control circuit according to claim 1, wherein said control circuit includes a switch connected to said monitoring circuit, a latch circuit connected to said switch, a NOR circuit connected to said latch circuit and an inverter connected to said external input node and providing a first control signal for said first transistor, a NAND circuit connected to said latch circuit and said external input node and providing a second control signal for said second transistor.

8. The intermediate voltage control circuit according to claim 7, wherein said switch is turned on when said enable signal is activated.

9. The intermediate voltage control circuit according to claim 2, wherein both of said first and second transistors have a threshold voltage whose value is higher than a value of said threshold voltage of said monitoring circuit.

10. An intermediate voltage control circuit comprising:

a first transistor connected between a power node and an output node, said output node connected to a signal line, said power node supplied with power supply voltage, said first transistor being an N-channel transistor;

a second transistor connected between said output node and ground, said second transistor being a P-channel transistor;

a monitoring circuit having a first inverter connected between said output node and a first node; and a control circuit comprising and AND circuit having inputs connected to an external input node supplied with an enable signal and said first node of said monitoring circuit and providing a first control signal for a gate of said first transistor, and an OR circuit having inputs connected to said external input node through a second inverter and said first node and providing a second control signal for a gate of said second transistor.

11. An intermediate voltage control circuit comprising:

a first transistor connected between a power node and an output node, said output node connected to a signal line, said power node supplied with power supply voltage, said first transistor being an N-channel transistor;

a second transistor connected between said output node and ground, said second transistor being a P-channel transistor;

a monitoring circuit having a first inverter connected between said output node and a first node; and a control circuit having a transfer gate connected between said first node and a second node, a latch circuit connected between said second node and a third node, a NOR circuit connected to said third node and an external input node through a second inverter and providing a first control signal for a gate of said first transistor, and a NAND circuit having inputs connected to said third node and said external input node and providing a second control signal for a gate of said second transistor.

* * * * *